(12) United States Patent
Sun et al.

(10) Patent No.: US 12,102,020 B2
(45) Date of Patent: Sep. 24, 2024

(54) SEMICONDUCTOR MEMORY DEVICES HAVING AN ELECTRODE WITH AN EXTENSION

(71) Applicant: GlobalFoundries Singapore Pte. Ltd., Singapore (SG)

(72) Inventors: Jianxun Sun, Singapore (SG); Ramasamy Chockalingam, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 478 days.

(21) Appl. No.: 17/647,006

(22) Filed: Jan. 4, 2022

(65) Prior Publication Data
US 2023/0217843 A1 Jul. 6, 2023

(51) Int. Cl.
*H10N 70/00* (2023.01)
(52) U.S. Cl.
CPC ......... *H10N 70/828* (2023.02); *H10N 70/063* (2023.02); *H10N 70/826* (2023.02); *H10N 70/8418* (2023.02)
(58) Field of Classification Search
CPC .. H10N 70/828; H10N 70/063; H10N 70/826; H10N 70/8418; H10N 70/011
See application file for complete search history.

(56) References Cited

U.S. PATENT DOCUMENTS

2011/0227030 A1 9/2011 Pickett et al.
2016/0141494 A1 5/2016 Lam et al.

OTHER PUBLICATIONS

U.S. Appl. No. 17/096,950, filed Nov. 23, 2021, Sun et al.
Ahn et al., Effects of a Nb nanopin electrode on the resistive random-access memory switching characteristics of NiO thin films, Nanoscale, 2018, pp. 13443-13448, vol. 10., The Royal Society of Chemistry 2018.
Gang Niu et al., Geometric conductive filament confinement by nanotips for resistive switching of HfO2-RRAM devices with high performance, Scientific Reports, May 2016, pp. 1-9, Scientific Reports.
A. Belmonte et al., Operating-Current Dependence of the Cu-Mobility Requirements in Oxide-Based Conductive-Bridge RAM, IEEE Electron Device Letters, Aug. 2015, pp. 775-777, vol. 36, IEEE.

*Primary Examiner* — Marvin Payen
(74) *Attorney, Agent, or Firm* — David Cain (57) ABSTRACT

A semiconductor memory device is provided. The memory device includes a first electrode, a resistive layer, and a second electrode. The resistive layer is arranged over the first electrode. The second electrode is arranged over the resistive layer. The second electrode includes a lower surface and an extension extending from under the lower surface. The extension is at least partially arranged within the resistive layer.

20 Claims, 4 Drawing Sheets

SEMICONDUCTOR MEMORY DEVICES HAVING AN ELECTRODE WITH AN EXTENSION

TECHNICAL FIELD

The present disclosure relates generally to semiconductor devices, and more particularly to semiconductor memory devices and methods of forming the same.

BACKGROUND

Semiconductor memory devices can be generally split into volatile memory devices and non-volatile memory (NVM) devices. Resistive random-access memory (RRAM) devices are a type of non-volatile memory (NVM) device.

An RRAM device uses a resistive layer arranged between two electrodes. The resistive layer may exhibit different resistance states, such as a high-resistance state and a low-resistance state. The RRAM device may operate by switching between those resistance states to represent one or more bits of information.

The resistive layer is normally insulating and exhibits a high-resistance state. However, upon application of a sufficiently large potential difference between the electrodes, conductive filaments may be formed in the resistive layer. The resistive layer becomes conductive and exhibits a low-resistance state. However, the conductive filaments are often randomly formed across many locations within the resistive layer, thereby subjecting the RRAM device to undesirable device-to-device variability and cycle-to-cycle variability.

Therefore, solutions are provided to overcome, or at least ameliorate, the disadvantages described above.

SUMMARY

To achieve the foregoing and other aspects of the present disclosure, semiconductor memory devices and methods of forming the same are presented.

According to an aspect of the present disclosure, a semiconductor memory device is provided. The memory device includes a first electrode, a resistive layer, and a second electrode. The resistive layer is arranged over the first electrode. The second electrode is arranged over the resistive layer. The second electrode includes a lower surface and an extension extending from under the lower surface. The extension is at least partially arranged within the resistive layer.

According to another aspect of the present disclosure, a semiconductor memory device is provided. The memory device includes a first dielectric layer, a first electrode, a resistive layer, a second dielectric layer, and a second electrode. The first electrode is arranged in the first dielectric layer and the resistive layer is arranged over the first electrode. The second dielectric layer is arranged over the resistive layer and the second electrode is arranged in the second dielectric layer. The second electrode is partially arranged over the resistive layer and includes an extension at least partially arranged within the resistive layer.

According to yet another aspect of the present disclosure, a method of forming a semiconductor memory device is provided. The method includes forming a first electrode and a resistive layer over the first electrode. A dielectric layer is formed over the resistive layer. A trench is formed in the dielectric layer and a trench extension is formed at least partially within the resistive layer. A second electrode is formed in the trench and the trench extension.

BRIEF DESCRIPTION OF THE DRAWINGS

The embodiments of the present disclosure will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to semiconductor devices, and more particularly to semiconductor memory devices and methods of forming the same.

A resistive random-access memory (RRAM) device is a type of non-volatile memory (NVM) device. The RRAM device generally includes a pair of electrodes and a resistive layer arranged between the pair of electrodes. The resistive layer may exhibit different resistance states, such as a high-resistance state and a low-resistance state, and the RRAM device may operate by switching between those resistance states. The low-resistance state and the high-resistance state of the resistive layer may be used to represent one or more bits of information.

The resistive layer is normally insulative and has a relatively high resistance, therefore is referred to as exhibiting a high-resistance state; the high-resistance state being representative of an "off" or "0" state. To program the RRAM device, a sufficiently large potential difference may be applied between the pair of electrodes to cause a dielectric breakdown of the resistive layer. Consequently, the resistive layer becomes conductive with the formation of conductive paths in the form of filaments between the pair of electrodes in the resistive layer. The conductive resistive layer may have relatively low resistance and may be referred to as exhibiting a low-resistance state; the low-resistance state being representative of an "on" or "1" state. To erase the RRAM device, a suitable potential difference may be applied between the pair of electrodes to break the conductive filaments, reverting the resistive layer to the insulative high-resistance state.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1:
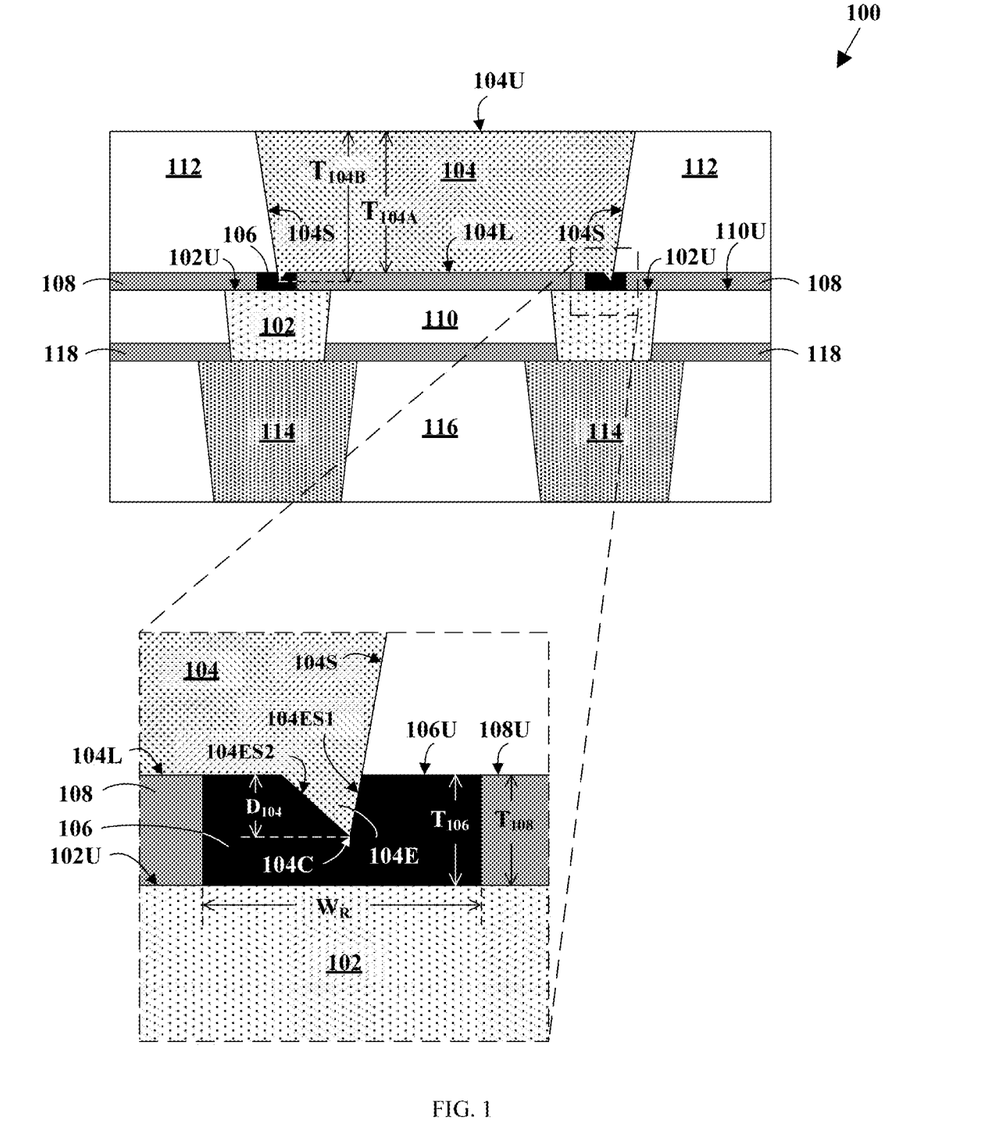
FIG. 1 is a cross-sectional view of a semiconductor memory device, according to an embodiment of the disclosure.

FIG. 1 is a cross-sectional view of an RRAM device 100, according to an embodiment of the disclosure. The RRAM device 100 may be arranged in a memory cell region of a semiconductor device (not shown) and the RRAM device 100 may be part of a plurality of memory devices arranged in an array configuration of rows and columns in the memory cell region. Only one memory device is illustrated for clarity purposes.

The RRAM device 100 may include an electrode 102, an electrode 104 arranged over the electrode 102, a resistive layer 106, and an insulating layer 108. The resistive layer 106 and the insulating layer 108 may be arranged between the electrode 102 and the electrode 104. The electrode 102 may be configured as a conductive via structure and the electrode 104 may be configured as a conductive line structure. The electrode 102 may be arranged in a dielectric layer 110 and the electrode 102 may have an upper surface 102U substantially coplanar with an upper surface 110U of the dielectric layer 110. The dielectric layer 110 may serve as an interlayer dielectric layer to electrically isolate the electrode 102 from adjacent conductive structures. The electrode 104 may be arranged in a dielectric layer 112 and the dielectric layer 112 may serve as an intermetal dielectric layer to electrically isolate the electrode 104 from adjacent conductive structures.

The dielectric layer 110 and the dielectric layer 112 may include an electrically insulative material, for example, silicon oxide, carbon-doped silicon oxide, tetraethoxysilane (TEOS), borophosphosilicate glass (BPSG), undoped silicate glass (USG), or amorphous silicon. In an embodiment of the disclosure, the dielectric layer 110 may include the same electrically insulative material as the dielectric layer 112. In another embodiment of the disclosure, the dielectric layer 110 may include a different electrically insulative material than the dielectric layer 112.

The electrode 104 may be partially arranged over the electrode 102. For example, the electrode 104 may be arranged over a portion of the electrode 102 and the dielectric layer 112 may be arranged over another portion of the electrode 102. In another example, the electrode 104 may include a sidewall 104S arranged over the electrode 102. As illustrated in FIG. 1, the RRAM device 100 may include two electrodes 102, though not necessarily so. Each of the electrode 102 may be arranged under the sidewalls 104S of the electrode 104.

The electrode 102 and the electrode 104 may include a conductive material, for example, copper, aluminum, tungsten, cobalt, nickel, hafnium, gold, silver, ruthenium, platinum, titanium, titanium nitride, tantalum, tantalum nitride, or combinations thereof. In an embodiment of the disclosure, the electrode 102 may include the same conductive material as the electrode 104. In another embodiment of the disclosure, the electrode 102 may include a different conductive material than the electrode 104.

The electrode 102 and the electrode 104 may each include a diffusion barrier liner (not shown) arranged on sidewalls and a lower surface thereof. The diffusion barrier liner may be necessary for highly diffusible conductive materials, such as copper. The diffusion barrier liner may serve to prevent potential electro-migration and intermixing of conductive materials from the electrode 102 and the electrode 104 to adjacent conductive structures that may potentially cause an electrical short. The diffusion barrier liners may include various metal nitrides, for example, titanium nitride, tantalum nitride, or tungsten nitride.

The RRAM device 100 may include a filament-type RRAM device such as, but is not limited to, an oxide random-access memory (OxRAM) device or a conductive bridge random-access memory (CBRAM) device. Where the RRAM device 100 may be an OxRAM device, the RRAM device 100 may be operated by the formation of oxygen vacancies in the resistive layer 106. Accordingly, the diffusion barrier liner may be relatively thick to minimize the diffusion of metallic ions, such as copper ions, from the electrode 104 to the electrode 102. Where the RRAM device 100 may be a CBRAM device, the RRAM device 100 may be operated by the diffusion of metallic ions, such as copper ions, from the electrode 102 or the electrode 104 through the resistive layer 106. Accordingly, the diffusion barrier liner may be relatively thin to enable the diffusion of such metallic ions.

The electrode 104 may be electrically isolated from the electrode 102 by the resistive layer 106 and the insulating layer 108. The resistive layer 106 may be arranged within and overlay a portion of the upper surface 102U of the electrode 102. The resistive layer 106 may also partially underlie the electrode 104. For example, a portion of the resistive layer 106 may be arranged between the electrode 102 and the electrode 104, and another portion of the resistive layer 106 may be arranged between the electrode 102 and the dielectric layer 112. In another example, the sidewall 104S of the electrode 104 may be arranged over the resistive layer 106.

The resistive layer 106 may include a dielectric material, for example, silicon oxide, hafnium oxide, tantalum oxide, titanium oxide, aluminum oxide, tungsten oxide, zirconium oxide, gadolinium oxide, magnesium oxide, or combinations thereof. In an embodiment of the disclosure, the resistive layer 106 may have a width $W_R$ and the width $W_R$ may range from about 50 nm to about 100 nm.

The insulating layer 108 may be arranged adjacent to the resistive layer 106. The insulating layer 108 may include an opening (not shown) such that the resistive layer 106 may be arranged therein. For example, the insulating layer 108 may include a first portion arranged adjacent to a first side of the resistive layer 106 and between the electrode 102 and the dielectric layer 112. The insulating layer 108 may further include a second portion arranged adjacent to a second side of the resistive layer 106 and between the electrode 102 and the electrode 104; the second side of the resistive layer 106 is laterally opposite to the first side. The second portion of the insulating layer 108 may be further arranged between the dielectric layer 110 and the electrode 104.

The insulating layer 108 may serve as a capping layer for the electrode 102 to prevent electro-migration and/or oxidation of conductive material therein. The insulating layer 108 may include an electrically insulative material having a higher dielectric breakdown voltage than the resistive layer 106. The insulating layer 108 may further provide a relatively high material removal selectivity to the dielectric layer 112, thereby allowing precision in forming overlying structures, such as the electrode 104. The term "material removal selectivity" as used herein refers to the material removal rate of one material relative to the material removal rate of another material, for example, the ratio of the material removal rate of the dielectric layer 112 to the material removal rate of the insulating layer 108. The term "relatively high material removal selectivity" as used herein refers to a characteristic between two materials, such that one material may be removed without substantially removing the other material, for example, the dielectric layer 112 may be preferentially removed such that the insulating layer 10 may remain substantially intact during the material removal process. The insulating layer 108 may include, but is not to, silicon nitride, silicon carbonitride, silicon carbide, or combinations thereof.

The resistive layer 106 and the insulating layer 108 may have a substantially equal thickness. For example, the resistive layer 106 may have a thickness $T_{106}$ and the insulating layer 108 may have a thickness $T_{108}$, and the thickness $T_{108}$ may be substantially equal to the thickness $T_{106}$. In another example, the resistive layer 106 may have an upper surface 106U and the insulating layer 108 may have an upper surface 108U, and the upper surface 108U of the insulating layer 108 may be substantially coplanar with the upper surface 106U of the resistive layer 106. In an embodiment of the disclosure, the thickness $T_{108}$ of the insulating layer 108 and the thickness $T_{106}$ of the resistive layer 106 may range from about 30 nm to about 150 nm.

To program the RRAM device 100, a sufficiently large potential difference may be applied between the electrode 102 and the electrode 104 to cause a dielectric breakdown of the resistive layer 106. Conductive paths in a form of conductive filaments may be formed in the resistive layer 106. The conductive filaments may be formed by diffusion or drift of electrical charges, for example, ions or electrons, from the electrode 102 or the electrode 104 induced by the potential difference. The conductive filaments may provide electrical coupling between the electrode 102 and the electrode 104, and the resistive layer 106 may be conductive and may exhibit a low-resistance state.

As used herein, when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

To erase the RRAM device 100, a suitable potential difference may be applied between the electrode 102 and the electrode 104 to break the conductive filaments in the resistive layer 106, reverting the resistive layer 106 to the insulative high-resistance state.

The electrode 104 may include a lower surface 104L and an extension 104E extending from under the lower surface 104L. For example, the lower surface 104L of the electrode 104 may be coplanar with the upper surface 106U of the resistive layer 106, i.e., the lower surface 104L of the electrode 104 may share a same plane as the upper surface 106U of the resistive layer 106.

The extension 104E may include tapered side surfaces 104ES1 and 104ES2 that converge to a corner 104C. The corner 104C may extend along the sidewalls 104S of the electrode 104 to form an edge under the electrode 104. For example, the extension 104E may include the side surface 104ES1 extending from the sidewall 104S of the electrode 104 to the corner 104C, and the laterally opposite side surface 104ES2 extending from the lower surface 104L to the corner 104C. The corner 104C may be substantially pointed, for example, the side surfaces 104ES1 and 104ES2 acquiring a V-shaped profile, or substantially rounded, for example, the side surfaces 104ES1 and 104ES2 acquiring a U-shaped profile.

As illustrated in FIG. 1, the electrode 104 may have an upper surface 104U and the corner 104C may have the deepest depth from the upper surface 104U. For example, the electrode 104 may include a first portion having a first thickness $T_{104A}$ between the upper surface 104U and the lower surface 104L, and a second portion having a second thickness $T_{104B}$ between the upper surface 104U and the corner 104C; the thickness $T_{104B}$ is thicker than the thickness $T_{104A}$.

The extension 104E may be at least partially arranged within the resistive layer 106. For example, the extension 104E may extend into the resistive layer 106 by a depth $D_{104}$; the depth $D_{104}$ being from the upper surface 106U of the resistive layer 106 to the corner 104C of the extension 104E of the electrode 104. The extension 104E may terminate within the resistive layer 106. For example, the depth $D_{104}$ of the extension 104E in the resistive layer 106 may be shallower than the thickness $T_{106}$ of the resistive layer 106. In another example, a portion of resistive layer 106 may be arranged under the extension 104E such that the extension 104E may not extend therethrough, and the portion of the resistive layer 106 may separate the extension 104E from the electrode 102.

The extension 104E may advantageously improve the performance of the RRAM device 100. Electric fields generated at corners or tapered regions of conductive structures may be relatively stronger than that of non-corner regions, i.e., a stronger localization of electric fields may be generated around the extension 104E of the electrode 104. Therefore, during a program operation, the relatively stronger electric fields generated around the extension 104E of the electrode 104 may substantially confine the formation of the conductive filaments to a region in the resistive layer 106 that is proximate to the extension 104E of the electrode 104.

Furthermore, due to the resistive layer 106 having a lower dielectric breakdown voltage than that of the insulating layer 108, the conductive filaments may be more readily formed in the resistive layer 106 than the insulating layer 108, and the insulating layer 108 may facilitate the confinement of the conductive filaments to within the resistive layer 106.

The ability to confine the formation of the conductive filaments is advantageous to minimize the variability of locations where the conductive filaments may be formed. The conductive filaments may not randomly form within the resistive layer 106. Such filament confinement may reduce the stochasticity of the conductive filaments, which in turn reduces the resistance variability of the resistive layer 106 in the high-resistance state. Controlled distribution of the conductive filaments may enhance the performance of the RRAM device 100, such as providing low device-to-device variability and cycle-to-cycle variability. Accordingly, the RRAM device 100 may achieve stable switching between the resistance states of the resistive layer 106 during the program operations and the erase operations and may also reduce the overall power consumption.

The RRAM device 100 may be electrically coupled to various conductive structures to send or receive electrical signals between other circuitry and/or electrical components (not shown) of the semiconductor device. For example, as illustrated in FIG. 1, the electrode 102 may be electrically coupled to a conductive structure 114 arranged in a dielectric layer 116. The conductive structure 114 may include a via structure, a line structure, or a combination thereof. In an embodiment of the disclosure, the conductive structure 114 may be a line structure that serves as a bit line of the RRAM device 100, and the electrode 104 may serve as a source line of the RRAM device 100.

The RRAM device 100 may further include an insulating layer 118 arranged over the conductive structure 114 and the dielectric layer 116. The electrode 102 may be arranged through the insulating layer 118 to be electrically coupled to the conductive structure 114. The insulating layer 118, similar to the insulating layer 108, may serve as a capping layer to prevent electro-migration and/or oxidation of conductive material from the conductive structure 114.

Figure 2:
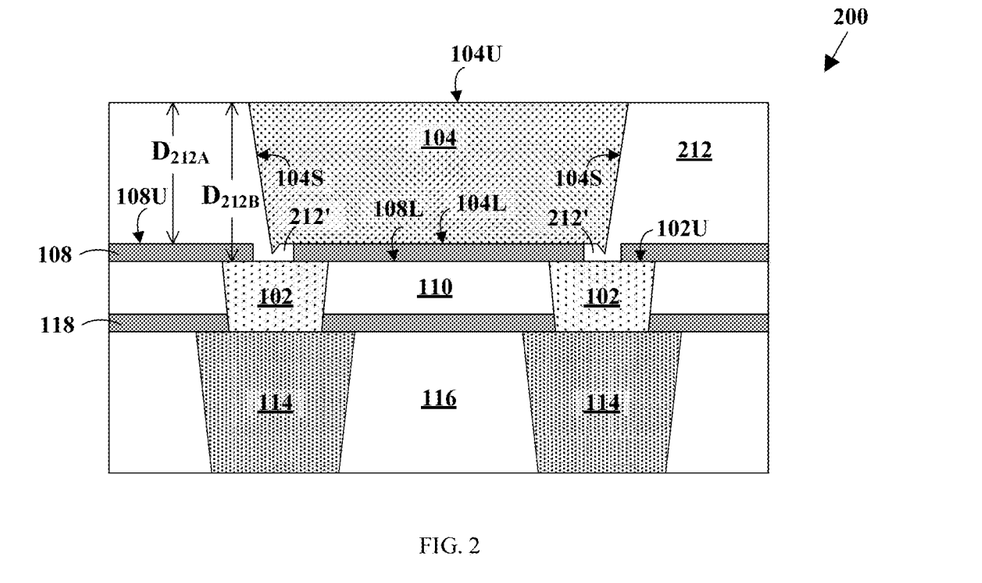
FIG. 2 is a cross-sectional view of a semiconductor memory device, according to another embodiment of the disclosure.

FIG. 2 is a cross-sectional view of an RRAM device 200, according to another embodiment of the disclosure. The RRAM device 200 may be similar to the RRAM device 100 in FIG. 100, and thus common features are labeled with the same reference numerals and need not be discussed. For example, similar to the RRAM device 100 in FIG. 1, the RRAM device 200 may include an electrode 102 arranged in a dielectric layer 110, an electrode 104 partially arranged over the electrode 102, and an insulating layer 108 arranged between the electrode 102 and the electrode 104.

The electrode 104 may be arranged in a dielectric layer 212. The insulating layer 108 may include an opening (not shown) within which a portion 212' of the dielectric layer 212 may fill. The dielectric layer 212 may include a first depth $D_{212A}$ and a second depth $D_{212B}$ from an upper surface 104U of the electrode 104. The first depth $D_{212A}$ may extend from the upper surface 104U of the electrode 104 to the upper surface 108U of the insulating layer 108. The second depth $D_{212B}$ may extend from the upper surface 104U of the electrode 104 to the upper surface 102U of the electrode 102 through the opening of the insulating layer 108. The first depth $D_{212A}$ may be shallower than the second depth $D_{212B}$.

The portion 212' of the dielectric layer 212 in the opening of the insulating layer 108 may serve as a resistive layer of the RRAM device 200; the portion 212' may be synonymous with the resistive layer 106 in FIG. 1. When a sufficiently large potential difference is applied between the electrode 102 and the electrode 104, conductive filaments may be formed in the portion 212' of the dielectric layer 212 and the RRAM device 200 may operate by switching between a high-resistance state and a low-resistance state of the portion 212' of the dielectric layer 212. In this embodiment, the dielectric layer 212 may include silicon oxide, TEOS, BPSG, USG, or amorphous silicon.

Figure 3:
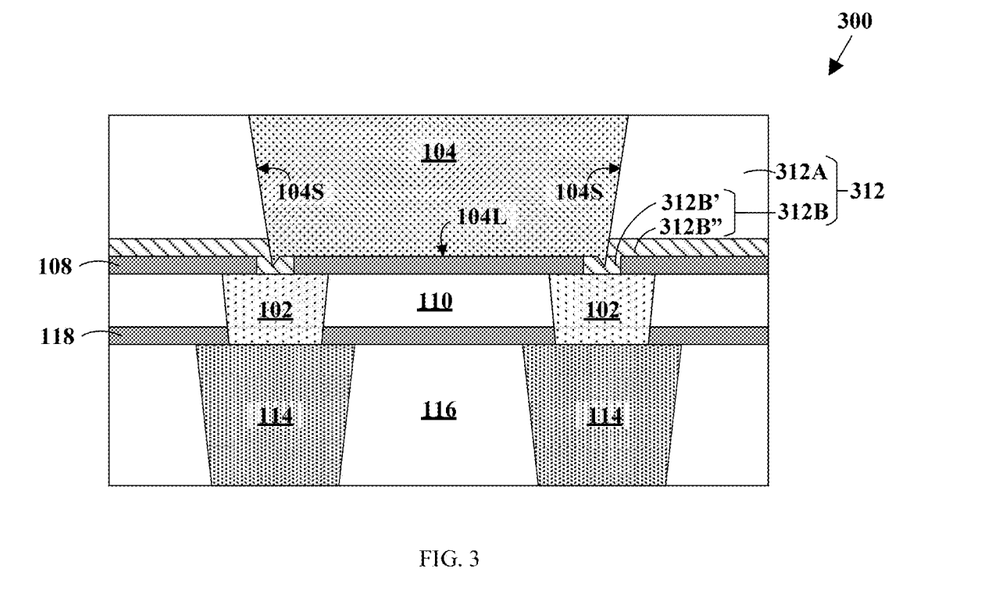
FIG. 3 is a cross-sectional view of a semiconductor memory device, according to yet another embodiment of the disclosure.

FIG. 3 is a cross-sectional view of an RRAM device 300, according to yet another embodiment of the disclosure. The RRAM device 300 may be similar to the RRAM device 200 in FIG. 2, and thus common features are labeled with the same reference numerals and need not be discussed. For example, similar to the RRAM device 200 in FIG. 2, the RRAM device 300 may include an electrode 102 arranged in a dielectric layer 110, an electrode 104 partially arranged over the electrode 102, and an insulating layer 108 arranged between the electrode 102 and the electrode 104.

The electrode 104 may be arranged in a dielectric layer 312. The dielectric layer 312 may include an upper portion 312A and a lower portion 312B arranged under the upper portion 312A, and the upper portion 312A and the lower portion 312B may have different densities. For example, the upper portion 312A of the dielectric layer 312 may have a lower density than the lower portion 312B.

The insulating layer 108 may include an opening (not shown) within which the lower portion 312B of the dielectric layer 312 may at least fill. In an embodiment of the disclosure, as illustrated in FIG. 3, the lower portion 312B of the dielectric layer 312 may overfill the opening of the insulating layer 108 such that a portion 312B' of the lower portion 312B may be arranged in the opening of the insulating layer 108 and another portion 312B" may overlay the insulating layer 108. In another embodiment of the disclosure, the lower portion 312B of the dielectric layer 312 may not overfill the opening of the insulating layer 108 such that the entire lower portion 312B may be arranged in the opening of the insulating layer 108, even though this embodiment is not illustrated in the accompanying drawings.

The portion 312B' of the dielectric layer 312 may serve as a resistive layer of the RRAM device 300; the portion 312B' may be synonymous with the resistive layer 106 in FIG. 1. The RRAM device 300 may operate by applying a sufficiently large potential difference between the electrode 102 and the electrode 104 to switch the resistance state of the portion 312B' of the dielectric layer 312. In this embodiment of the disclosure, the lower portion 312B of the dielectric layer 312 may include an electrically insulative material, for example, TEOS or silicon oxide, and the upper portion 312A of the dielectric layer 112 may include an electrically insulative material having a lower density, for example, carbon-doped oxide like carbon-doped hydrogenated silicon oxide.

The lower portion 312B of the dielectric layer 312 having a higher density advantageously enable a more effective process control during the formation of a trench (not shown) in the dielectric layer 312. The trench may be subsequently filled with a conductive material to form the electrode 104. For example, the lower portion 312B of the dielectric layer 312 having a higher density may result in a lower material removal rate than the upper portion 312A having lower density, thereby allowing a more precise formation of the trench in the dielectric layer 312.

FIGS. 4A to 4E are cross-sectional views that illustrate a method of forming an RRAM device 400, according to an embodiment of the disclosure. The RRAM device 400 may be similar to the RRAM device 100 in FIG. 1. Certain structures may be fabricated, for example, using known processes and techniques, and specifically disclosed processes and methods may be used to achieve individual aspects of the present disclosure.

As used herein, "deposition techniques" refer to the process of applying a material over another material (or a substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD), or electro-plating.

Additionally, "patterning techniques" include deposition of material or photoresist, patterning, exposure, development, etching, cleaning, and/or removal of the material or photoresist as required in forming a described pattern, structure, or opening 420. Exemplary examples of techniques for patterning include, but are not limited to, wet etch lithographic processes, dry etch lithographic processes, or direct patterning processes.

Figure 4A:
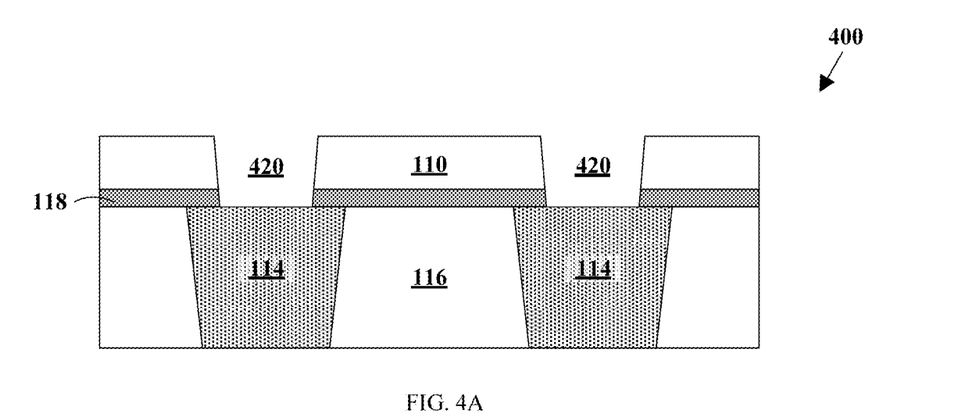
FIGS. 4A to 4E are cross-sectional views that illustrate a method of forming a semiconductor memory device, the semiconductor device being similar to the semiconductor device in FIG. 1, according to an embodiment of the disclosure.

As illustrated in FIG. 4A, a conductive structure 114 may be formed in dielectric layer 116. An insulating layer 118 and a dielectric layer 110 may be sequentially deposited over the conductive structure 114 and the dielectric layer 116 using a deposition technique. An opening 420 may be formed through the insulating layer 118 and the dielectric layer 110 using a patterning technique. The opening 420 may expose a portion of the conductive structure 114.

The conductive structure 114 may include a conductive material. The dielectric layer 116 and the dielectric layer 110 may include an electrically insulative material, though not necessarily the same electrically insulative material. The insulating layer 118 may also include an electrically insulative material and the electrically insulative material of the insulating layer 118 may include a higher dielectric constant than the electrically insulative material of the dielectric layer 116 and/or the dielectric layer 110.

Figure 4B:
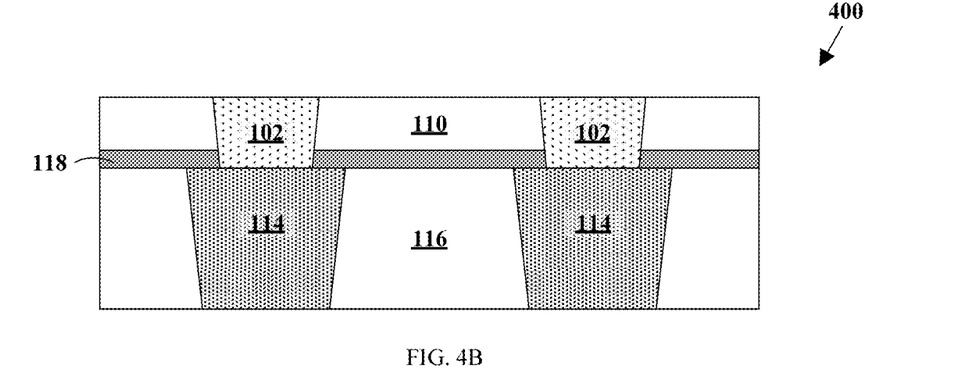

FIG. 4B illustrates the RRAM device 400 after forming an electrode 102 in the opening 420, according to an embodiment of the disclosure. A conductive material may be deposited in the opening 420 using a deposition technique to form the electrode 102. A planarization technique, such as a chemical-mechanical planarization (CMP) process, may be performed to remove any excess conductive material deposited over the dielectric layer 110 and to form a substantially planar topography over the electrode 102 and the dielectric layer 110. The electrode 102 may or may not be the same conductive material as the conductive structure 114. The electrode 102 may be electrically coupled to the conductive structure 114.

Figure 4C:
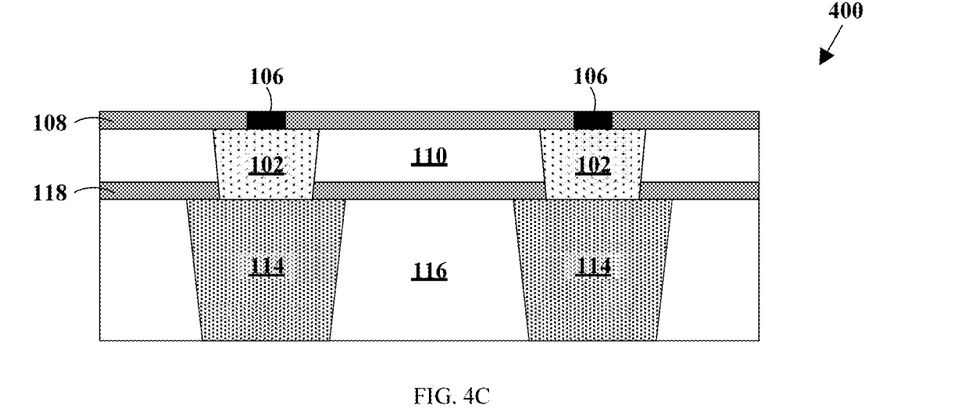

FIG. 4C illustrates the RRAM device 400 after forming a resistive layer 106 and an insulating layer 108 over the electrode 102, according to an embodiment of the disclosure. A first electrically insulative material may be deposited over the electrode 102 and the dielectric layer 110 using a deposition technique to form the insulating layer 108. An opening (not shown) may be formed in the insulating layer 108 using a patterning technique. The opening may expose a portion of the underlying electrode 102.

A second electrically insulative material may be deposited into the opening of the insulating layer 108 to form the resistive layer 106. The second electrically insulative material may have a lower dielectric breakdown voltage than that of the first electrically insulative material. A planarization technique may be performed to form a substantially planar topography over the resistive layer 106 and the insulating layer 108.

Figure 4D:
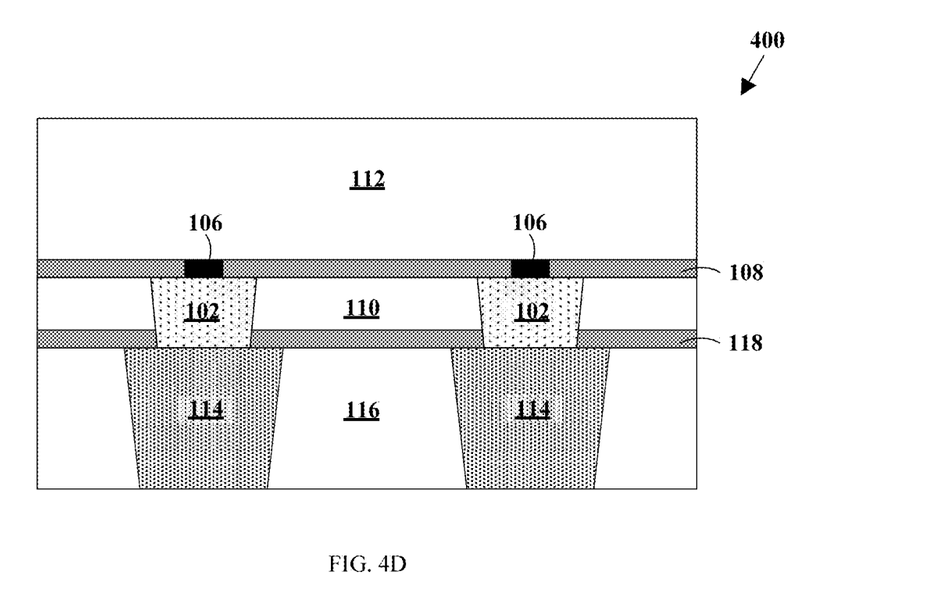

FIG. 4D illustrates the RRAM device 400 after forming a dielectric layer 112 over the resistive layer 106 and the insulating layer 108, according to an embodiment of the disclosure. The dielectric layer 112 may be deposited over the resistive layer 106 and the insulating layer 108 using a deposition technique. The dielectric layer 112 may include the same electrically insulative material as the dielectric layer 110 and/or the dielectric layer 116, though not necessarily so.

In an embodiment where the resistive layer 106 may include the same electrically insulative material as the dielectric layer 112, similar to the RRAM device 200 in FIG. 2, the dielectric layer 112 may concurrently fill the opening of the insulating layer 108 in FIG. 4C while forming the dielectric layer 112.

Figure 4E:
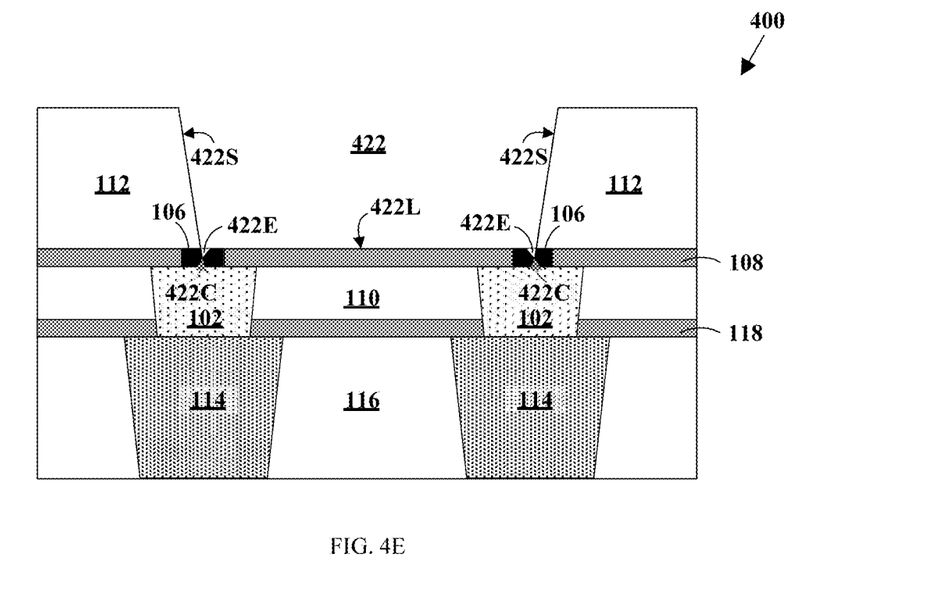

FIG. 4E illustrates the RRAM device 400 after forming a trench 422 in the dielectric layer 112, according to an embodiment of the disclosure. The trench 422 may be formed in the dielectric layer 112 using a patterning technique to remove a portion of the dielectric layer 112 to expose a portion of the resistive layer 106 and a portion of the insulating layer 108. The insulating layer 108 may serve as an etch stop layer by providing a relatively high etch selectivity to the overlying dielectric layer 112. For example, during the formation of the trench 422, the removal of material from the dielectric layer 112 may not substantially affect the insulating layer 108.

A trench extension 422E may be formed under the trench 422 and in the resistive layer 106. The trench extension 422E may terminate within the resistive layer 106 and may not extend therethrough. For example, the trench 422 may include trench sidewalls 422S and a lower trench surface 422L, and the trench extension 422E may be formed extending from under the lower trench surface 422L into the resistive layer 106. The trench extension 422E may include tapered side surfaces converging to a trench corner 422C.

In an embodiment of the disclosure, the trench extension 422E may be concurrently formed during the formation of trench 422. For example, the patterning technique to form the trench 422 may further concurrently remove a portion of the resistive layer 106 to form the trench extension 422E therein. The trench extension 422E may be a micro-trench. A micro-trench may be a narrow groove formed in a dielectric layer during a material removal technique, such as a plasma etching process, to define a structure, for example, a trench or a gate structure. The micro-trench is generally considered an inherent process defect as the micro-trench is undesirably formed as the result of an increase in the localized etch rate due to bombardment by charged ions scattered from sidewalls of a patterning layer, such as a photoresist, and/or sidewalls of the structure. A micro-trench structure may be a micro-trench, i.e., an opening or void, filled with a conductive material. The micro-trench structure reduces the distance to an underlying conductive structure and the reduced distance may adversely affect the electrical performance of a semiconductor device, such as a reduced time-dependent dielectric breakdown (TDDB).

In another embodiment of the disclosure, the trench extension 422E may be formed by deliberately removing a portion of the resistive layer 106 after forming the trench 422.

The trench 422 may be subsequently filled with a conductive material to form an electrode 104. The conductive material may include the same conductive material as the electrode 102 or may include a different conductive material than the electrode 102.

For the operation of the RRAM device 400, the electrode 102 and the electrode 104 may be electrically isolated by the resistive layer 106. Accordingly. the resistive layer 106 may be configured with a thickness such that the trench extension 422E may terminate within the resistive layer 106 and not extend therethrough to be electrically connected to the electrode 102. In an embodiment of the disclosure, the thickness of the resistive layer 106 may range from 30 nm to about 150 nm.

As presented in the above disclosure, semiconductor memory devices and methods of forming the same are presented. The memory device may be a filament-type RRAM device, such as an OxRAM device or a CBRAM device. The RRAM device may include a pair of electrodes, an insulating element, and a resistive layer.

One electrode of the pair of electrodes may include an extension arranged in the resistive layer. The RRAM device may operate by applying a substantially large potential difference between the pair of electrodes to cause a dielectric breakdown of the resistive layer. Conductive filaments may be formed in the resistive layer.

The extension may advantageously improve the performance of the RRAM device by substantially confining the formation of the conductive filaments to a region in the resistive layer that is proximate to the extension of the electrode. The substantially confined region of conductive filaments advantageously reduces the variability of the resistive layer and provides improved high device-to-device control and cycle-to-cycle control.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device, comprising:
   a first electrode;
   a resistive layer over the first electrode; and
   a second electrode over the resistive layer, the second electrode comprises a lower surface and an extension extending from under the lower surface and at least partially arranged within the resistive layer.

2. The memory device of claim 1, wherein the extension of the second electrode has tapered side surfaces that converge to a corner.

3. The memory device of claim 1, wherein the resistive layer comprises an upper surface, and the upper surface of the resistive layer share a same plane as the lower surface of the second electrode.

4. The memory device of claim 1, wherein the second electrode is partially arranged over the resistive layer.

5. The memory device of claim 4, wherein the second electrode comprises a side surface, and the extension of the second electrode extends from the side surface and partially into the resistive layer.

6. The memory device of claim 1, wherein the second electrode comprises a first portion having a first thickness and a second portion having a second thickness, the second thickness is thicker than the first thickness and the second portion comprises the extension.

7. The memory device of claim 1, wherein the first electrode has an upper surface, and the resistive layer is arranged within and overlays a portion of the upper surface of the first electrode.

8. The memory device of claim 1, wherein the first electrode has an upper surface, and the memory device further comprises an insulating layer arranged partially over the upper surface of the first electrode and at laterally opposite sides of the resistive layer.

9. The memory device of claim 8, wherein the insulating layer comprises an electrically insulative material and the resistive layer comprises another electrically insulative material, and the electrically insulative material of the insulating layer has a higher dielectric breakdown voltage than the electrically insulative material of the resistive layer.

10. The memory device of claim 8, wherein the insulating layer and the resistive layer have a substantially equal thickness.

11. A memory device, comprising:
    a first dielectric layer;
    a first electrode in the first dielectric layer;
    a resistive layer over the first electrode;
    a second dielectric layer over the resistive layer; and
    a second electrode in the second dielectric layer, the second electrode is partially arranged over the resistive layer and comprises an extension at least partially arranged within the resistive layer.

12. The memory device of claim 11, wherein the resistive layer comprises a portion arranged under the extension.

13. The memory device of claim 11, wherein the resistive layer and the second dielectric layer consist essentially of the same electrically insulative material.

14. The memory device of claim 13, wherein the electrically insulative material is silicon oxide.

15. The memory device of claim 11, wherein the resistive layer and the second dielectric layer comprises an electrically insulative material having different densities.

16. The memory device of claim 15, wherein the resistive layer comprises a first portion having a first density and a second portion having a second density under the first portion, the second density is lower than the first density.

17. The memory device of claim 11, wherein the first electrode is a via structure.

18. The memory device of claim 11, wherein the second electrode is a line structure.

19. A method of forming a memory device, comprising:
    forming a first electrode;
    forming a resistive layer over the first electrode;
    forming a dielectric layer over the resistive layer;
    forming a trench and in the dielectric layer and a trench extension at least partially within the resistive layer; and
    forming a second electrode in the trench and the trench extension.

20. The method of claim 19, wherein forming the trench and the trench extension comprises concurrently removing a portion of the dielectric layer and a portion of the resistive layer to form the trench and the trench extension, respectively.

* * * * *